United States Patent [19]

Tunematu et al.

[11] 4,163,202

[45] Jul. 31, 1979

[54] TUNING APPARATUS AND METHOD OF PRODUCING THE SAME

[75] Inventors: Toyoaki Tunematu, Kanzaki; Seiichi Takeno; Testuo Yamaguchi, both of Youkaichi, all of Japan

[73] Assignee: Murata Manufacturing Co., Ltd., Kyoto, Japan

[21] Appl. No.: 893,394

[22] Filed: Apr. 4, 1978

[30] Foreign Application Priority Data

Apr. 15, 1977 [JP] Japan .............................. 52-48167[U]

[51] Int. Cl.² .............................................. H03J 3/20
[52] U.S. Cl. ......................................... 334/76; 29/606; 29/628; 336/83; 361/270; 361/310
[58] Field of Search ....................... 333/82 R; 336/83; 361/308, 268, 309, 270, 312, 310; 29/605, 606; 323/76; 334/74–76

[56] References Cited

U.S. PATENT DOCUMENTS

| | | | |
|---|---|---|---|
| 2,648,031 | 8/1953 | Lang et al. .......................... | 334/74 X |
| 2,830,698 | 4/1958 | Coda et al. ......................... | 361/321 X |
| 3,090,907 | 5/1963 | Maeda ................................. | 336/83 X |

*Primary Examiner*—Paul L. Gensler
*Attorney, Agent, or Firm*—Birch, Stewart, Kolasch and Birch

[57] ABSTRACT

A tuning apparatus and a method of producing the same. The tuning apparatus comprises a base having a recess for receiving a capacitor therein, and coils mounted on the base, wherein the front ends of the comb teeth of two comb-shaped formed parts obtained by press-working an electrically conductive metal sheet are received in the recess and are fixed in position by pouring resin into the recess, the roots of the comb teeth of the comb-shaped formed parts being then severed, thereby separating the comb teeth from each other to provide independent external terminals. The comb teeth include connector comb teeth whose ends are directly connected to the capacitor terminals, and a presser tooth which urges the capacitor toward the connector comb teeth.

16 Claims, 6 Drawing Figures

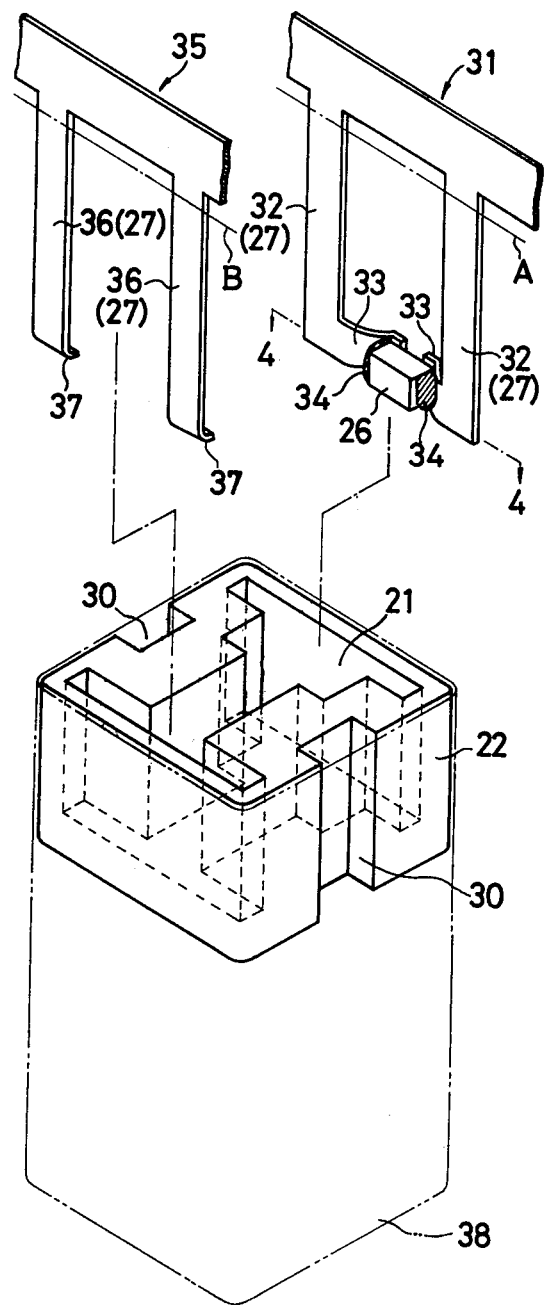

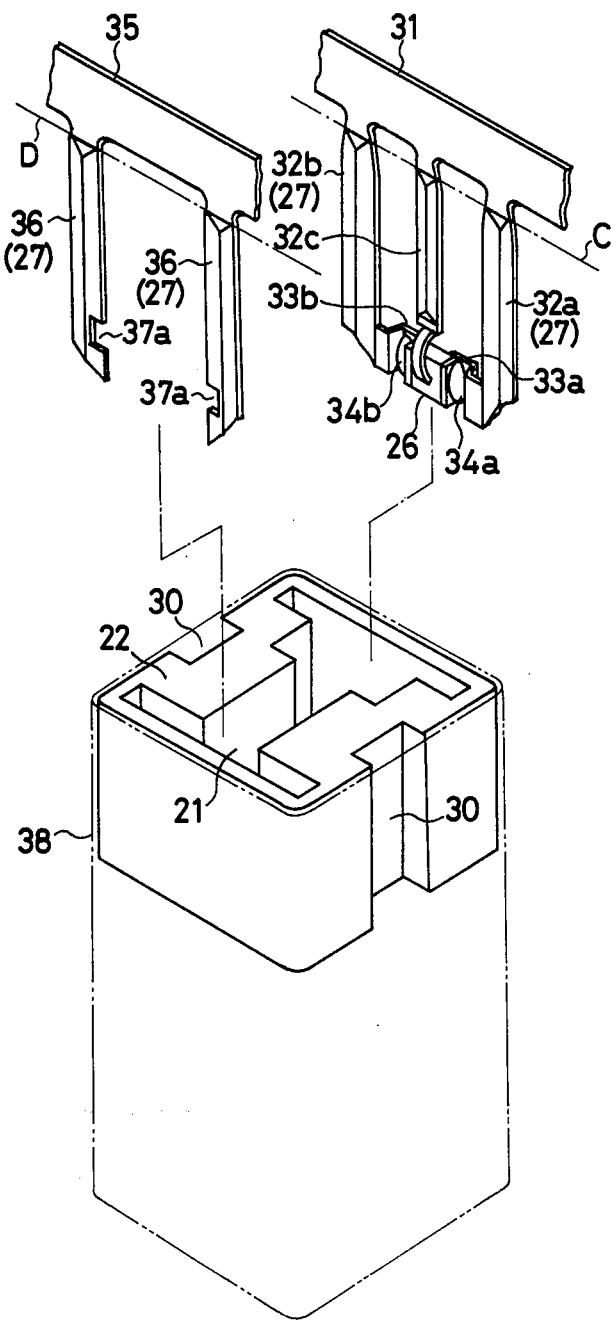

TUNING APPARATUS AND METHOD OF PRODUCING THE SAME

BACKGROUND OF THE INVENTION

1. Field of the Invention

This invention relates to a tuning apparatus and a method of producing the same and more particularly it relates to improvements in the construction of the tuning capacitor and terminals.

2. Description of the Prior Art

FIG. 1 is a sectional view of a construction for explanation of a prior art tuning apparatus of interest to the present invention, illustrating a conventional intermediate frequency transformer. The intermediate frequency transformer 10 shown therein comprises a resin base 12 having a recess 11 formed in the bottom thereof, with coils 13 mounted on the base 12. In association with said coils 13, there are provided a drum core 14 and a cap core 15, which is threadedly installed, adjustments of the inductance being made by tuning said cap core 15. Received in the recess 11 formed in the base 12 is a tuning capacitor 16 of, e.g. the lead-attached cylinder type. A plurality of round-pin terminals 17 are pressure-inserted into the surface of the base 12. Leads 18 from said coils 13 and leads 19 from said capacitor 16 are wound around said pin terminals 17 and fixed in position by the solder dip process.

The conventional intermediate frequency transformer as described above, however, has disadvantages or problems which follow.

When the pressure-inserting operation on the terminals 17 is to be carried out by an automatic machine, the cost will increase unless the number of articles to be produced is relatively large. Since the tuning capacitor 16 employed is, in most cases, of the lead-attached cylinder type, it is difficult to automate the installing operation and the size is large. Since the tuning capacitor 16 is received in the recess 11 formed in the bottom surface of the base 12, the characteristics would be deteriorated as by the sticking of flux during the soldering operation. Since the tuning capacitor 16 itself is exposed, it is susceptible to moisture and other influences from the ambient atmosphere. Further, since the terminals 17 are pressure-inserted after the formation of the base 12, they tend to come off, breaking the leads.

SUMMARY OF THE INVENTION

The present invention is capable of eliminating the disadvantages of problems described above.

In brief, a tuning apparatus according to the invention comprises a capacitor chip, a coil, a base member having a hollow space for receiving said capacitor chip therein and for mounting said coil on one surface thereof, and a plurality of external terminals projecting from said base member and electrically connected to said capacitor chip and said coil, said plurality of external terminals including at least two external terminals which are prepared from a comb-shaped formed part having a plurality of comb teeth in the form of an electrically conductive member in such a manner that the front ends of at least two comb teeth selected from said plurality of comb teeth are inserted into said hollow space and fixed in position by resin poured into said hollow space and the roots of said comb teeth are then severed so as to separate said comb teeth from each other. Further, the two terminals of the capacitor chip are directly connected to the portions corresponding to said front ends of said comb teeth of the two external terminals selected from said at least two external terminals. Therefore, in the base structure, said capacitor chip and one of the respective ends of said at least two external terminals are fixed in position in said hollow space of said base member in such a condition that they are covered with said resin.

In a more preferable embodiment of the invention, in addition to said two comb teeth, a third comb tooth of said comb-shaped formed part is inserted into said hollow space. The third comb tooth is arranged to press said capacitor chip between said two comb teeth and functions to advantageously position the capacitor chip until the latter is electrically connected and mechanically fixed in position.

A method of producing tuning apparatus according to the invention, in brief, is roughly divided into the step of producing a base structure and other steps. The step of producing a base structure comprises the step of preparing a comb-shaped electrically conductive metal member including at least two comb teeth integrally connected at one of their respective ends, the step of electrically connecting a capacitor chip between the other ends of the comb teeth of the comb-shaped metal member, the step of preparing a base member formed with a hollow space for receiving said other ends of the comb teeth and said capacitor chip, the step of inserting said metal member into the hollow space of said base member and positioning said metal member therein, the step of pouring said resin into said hollow space of said base member, said base member is fixed in position by said resin, and the step of severing the other ends of said comb teeth. The said other steps include the step of fixing the coil to said base member, and the step of connecting the terminals of said comb teeth.

In a more preferable embodiment of the invention, said comb-shaped metal member has an additional comb tooth, which serves to temporarily position said capacitor chip by clamping the latter between it and said at least two comb teeth, in which condition said capacitor chip is electrically connected to said at least two comb teeth, said additional comb tooth being also severed when said comb teeth are severed.

Accordingly, a principal object of the invention is to provide a construction for a tuning apparatus suitable for automating the operation of fastening the external terminals to the base member, and to provide a method of producing the same.

Another object of the invention is to provide a tuning apparatus suited for mass-production, and a method of producing the same.

Another object of the invention is to provide a construction for a tuning apparatus capable of protecting the capacitor from the influences of the ambient atmosphere, and a method of producing the same.

Another object of the invention is to provide a construction for a tuning apparatus whose characteristics do not vary from those of other tuning apparatus in the same lot, and a method of producing the same.

A further object of the invention is to provide a construction for a tuning apparatus capable of assuring highly reliable electric connections between the elements and the external terminals and making it possible to reduce the number of such relatively troublesome connections, and a method of producing the same.

These and other objects and features of the invention will become more apparent from the following detailed description given with reference to the accompanying drawings.

BRIEF DESCRIPTION OF THE DRAWINGS

FIG. 3 is a perspective view, exploded and enlarged, illustrating the principal portion of the intermediate frequency transformer of FIG. 2;

FIG. 6 is a perspective view, exploded and enlarged, illustrating the principal portion of the intermediate frequency transformer of FIG. 5.

DESCRIPTION OF THE PREFERRED EMBODIMENTS

Figure 2:
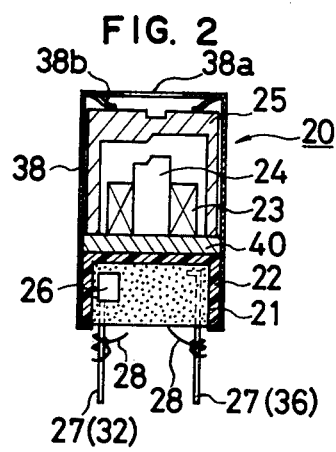
FIG. 2 is a sectional view of an intermediate frequency transformer according to an embodiment of the invention.

FIG. 2 is a sectional view of an intermediate frequency transformer according to an embodiment of the invention. FIG. 3 is a perspective view, enlarged and exploded, illustrating the principal portion of the intermediate frequency transformer of FIG. 2.

Referring to FIG. 2, the arrangement related to the coils 23 of an intermediate frequency transformer 20 shown therein will be described. In association with the coils 23, there are provided a core 24 and a cap core 25. The cap core 25 is supported on a support block 40 to be later described so as to be rotatable with respect to a resin base 22, and the inductance is adjusted according to the rotation thereof. More specifically, the downward inner surface of the cap core 25 and the upward surface of the upper end of the core 24 are each formed with a step, so that according as the cap core 25 is rotated, the opposed area between said steps and the distance therebetween vary. In addition, the arrangement described above does not form part of the invention, so that a further detailed description thereof will be omitted. Next, the arrangement related to the resin base 22 will be described.

The bottom surface of the resin base 22 is best seen in FIG. 3. The arrangement of the resin base 22 will now be described with reference to FIG. 3. The bottom surface is formed with a substantially H-shaped recess 21. As will be later described, a capacitor and external terminals will be inserted into said recess 21 and fixed in position by pouring resin thereinto.

Mutually oppositely directed outer lateral surfaces of the base 22 are provided with grooves 30 for receiving the leads 28 (FIG. 2) from the coil 23 therein to guide them to the terminals.

Also referring to FIG. 3, the arrangement related to the terminals will be described. One formed part 31 is obtained by press-working an electrically conductive metal sheet, and it is in the form of a comb. In addition, only a portion including two comb teeth 32 is shown in FIG. 3, but actually the formed part 31 has many comb teeth 32, and the process of insertion into the base 22 to be later described is performed by using the formed part 31 having many comb teeth 32. The ends of these two comb teeth 32 are formed with connecting pieces 33 inwardly extending toward each other, said connecting pieces 33 having been worked to have a suitable form. By utilizing such pair of connecting pieces 33, a capacitor chip 26 having terminals on opposite sides thereof is disposed, and positioned by a suitable jig (not shown) it is soldered as at 34. Such formed part 31 is inserted into the recess 21 in a direction shown in a dot-and-dash line. The other formed part 35 is also comb-shaped, and though not so illustrated, it is formed with a number of comb teeth 36. The ends of the comb teeth 36, preferably, are formed with bends 37. This formed part 35, too, is guided in a direction shown in a dot-and-dash line and inserted into the recess 21. After insertion, resin is poured into the recess 21. Therefore, when the resin has set, the parts are fixed in position. In addition, the pouring of resin and the insertion of the formed parts 31 and 35 may be effected in reverse order. As is clear from the shape of the front ends of the comb teeth 32 and 36, the comb teeth, unlike the previously described pin terminals 17, will never come off. The formed parts 31 and 35 are then severed at places indicated by dot-and-dash lines A and B. When they are thus severed the comb teeth 32 and 36 are respectively separated to form flat terminals 27 (FIG. 2). The leads 28 from the coils 23 are led through the grooves 30 to the terminals 27 and wound around the latter and are fixed in position by the solder dip process. Further, a case 38 is prepared, whereby the assembly including the base 22 and the rotatable cap core 25 is housed. In addition, the upper end surface (FIG. 2) of the case 38 is provided with an opening 38a for operation on the upper end surface of the cap core 25. The cap core 25 are downwardly urged by spring tabs 38b projecting from the inner surface of the upper end wall of the case 38, whereby a suitable rotative resistance is imparted to the cap core 25.

Figure 1:
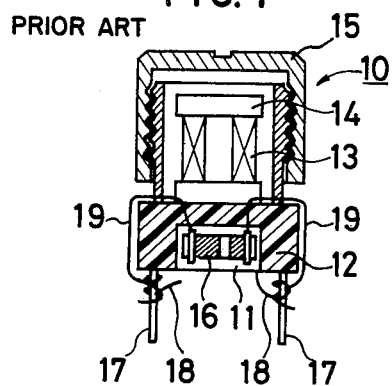
FIG. 1 is a sectional view of a construction for explanation of a prior art tuning apparatus of interest to the present invention.
Figure 4:
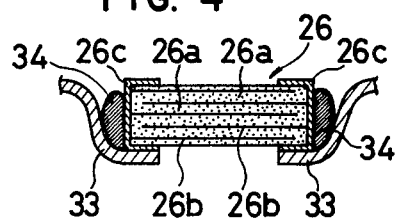
FIG. 4 is an enlarged section taken along the line 4—4 of FIG. 3.

Preferably, the capacitor chip 26 is of the multilayered type. The multilayered type capacitor is superior in that it has a large capacity for its small size. FIG. 4 is a section taken along the line 4—4 of FIG. 3.

Referring to FIG. 4, the multilayered type capacitor chip 26 comprises a plurality of ceramic dielectric layers 26a alternating with inner electrodes 26b, and outlet electrodes 26c disposed on opposite sides. Alternate inner electrodes 26b are connected to one outlet electrode 26c and the other inner electrodes 26b are connected to the other outlet electrode 26c. The masses of solder 34 for electrically connecting the capacitor chip 26 to the comb teeth 32 are disposed in contact with both the outlet terminals 26c and the connecting pieces 33.

The coils 23 and core 24 to be fixed on the base 22 through a support block 40 may be fixed on the base in advance or they may be fixed thereon after the base structure including the base 22 has been completed.

Figure 5:
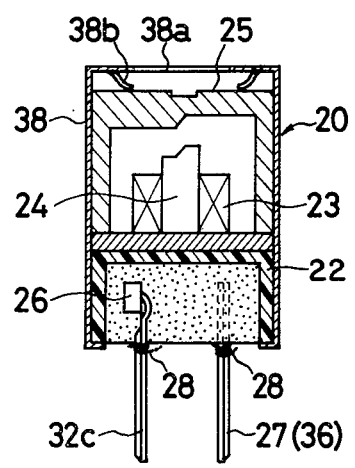
FIG. 5 is a sectional view of an intermediate frequency transformer according to another embodiment of the invention.

FIGS. 5 and 6 illustrate another embodiment of the invention. In FIGS. 5 and 6, the parts which correspond to those shown in FIGS. 2 and 3 are given like reference characters, and only the features peculiar to this embodiment will be described below.

In the arrangement related to the terminals, one formed part 31 includes a set of three comb teeth 32a, 32b, 32c. In addition, only a portion including a set of three comb teeth 32a, 32b 32c is illustrated, but actually the formed part 31 has a plurality of sets each comprising three such comb teeth 32a, 32b 32c. Of these three comb teeth 32a, 32b, 32c in each set, the comb teeth 32a and 32b on the opposite sides are formed with connecting pieces 33a and 33b inwardly extending toward each other, said connecting pieces having been worked to have a suitable form. Further, of the comb teeth 32a, 32b, 32c, the intermediate one 32c has been worked so that it is capable of mechanically holding the capacitor chip 26 by utilizing the resilience of the formed part 31, as shown in FIG. 6. Therefore, of the three comb teeth 32a, 32b, 32c, the two comb teeth 32a and 32b on the opposite sides have the capacitor chip 26 placed thereon and serve as connector comb teeth to which the capacitor chip is directly connected by the masses of solder 34a and 34b. The intermediate comb tooth 32c serves as a presser comb tooth which presses the capacitor chip 26 toward the connector comb teeth.

In reality, in order to connect the capacitor chip 26 to the connecting pieces 33a and 33b, the formed part 31 with the capacitor chip 26 mechanically held by the comb teeth 32a and 32b is immersed in a bath of solder (not shown) and then withdrawn therefrom whereby the connecting pieces 33a and 33b and the electrodes are joined by the masses of solder 34a and 34b. This process can be performed more easily than in the preceding embodiment. Such formed part 31 is inserted into the recess 21 in the direction indicated by the dot-and-dash line. The other formed part 35 is also in the form of a comb, and, though not so illustrated, it is formed with many comb teeth 36, as in the case of the formed part 31. The comb teeth 36 are formed with notches 37a adjacent their ends, and their ends are sharpened. The formed part 35 is also guided in the direction indicated by the dot-and-dash line and is inserted into the recess 21.

After the formed parts are inserted into the recess, a resin is poured into the recess 21 and allowed to set, whereby the formed parts 31 and 35 are fixed in position. As is clear from the shape of the front ends of the comb teeth 32a, 32b, 32c and 36, the comb teeth, unlike the previously described pin terminals 17, will never come off. The formed parts 31 and 35 are then severed at places indicated by the dot-and-dash lines C and D, whereupon the comb teeth 32a, 32b, 32c and 36 are separated from each other to form independent flat terminals 27 (FIG. 2). The leads 28 from the coils 23 are guided to the terminals 27 via the grooves 30 and wound around the terminals 27 and are fixed in position by the solder dip process. The terminal 27 corresponding to the comb tooth 32c is not connected to the capacitor chip 26 as it is electrically isolated from the latter, and it is possible to use said terminal as an intermediate tap terminal by winding a lead 28 from the coil 23 therearound. Further, the presence of the terminal 27 on the bottom surface of the base 22 makes the positions of the terminals asymmetrical, facilitating the ascertainment of directionality, i.e. of the primary and secondary sides. Further, a case 38 is prepared, whereby the portion including the base 22 and cap core 25 are housed.

In addition, in this embodiment, as best seen in FIG. 6, the comb teeth 32a, 32b, 32c and 36 are bent into a V-shape in cross-section so as to have a longitudinally extending ridge. With such arrangement, even if the formed parts 31 and 35 are formed of a thin material, their resistance to bending can be increased.

While the embodiments described so far have been directed to an intermediate frequency transformer, they may be high frequency transformers, generally the same concept being applicable to tuning apparatus including an inductance and a capacitance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A tuning apparatus comprising a capacitor chip, a coil, a base member which has a hollow space for receiving said capacitor chip and on which said coil is mounted, and a plurality of external terminals projecting from said base member and electrically connected to said capacitor chip and coil, said plurality of external terminals being prepared of comb-shaped formed parts in the form of electrically conductive metal members each having a plurality of comb teeth, wherein at least two comb teeth selected from said plurality of comb teeth are inserted at their front ends into said hollow space of said base member and fixed in position by resin poured into said hollow space, the roots of said comb teeth being then severed to separate said comb teeth from each other, thereby providing at least two independent external terminals, said capacitor chip having its two terminals directly connected to the portions of said at least two external terminals corresponding to said front ends of said comb teeth, whereby said capacitor chip and the front ends of said comb teeth are covered with said resin within said hollow space.

2. A tuning apparatus as set forth in claim 1, wherein said front ends of said comb teeth are given such a shape as to prevent the comb teeth from coming off from said resin.

3. A tuning apparatus as set forth in claim 1, wherein the front ends of the two comb teeth to which the two terminals of said capacitor chip are connected are formed to extend toward each other.

4. A tuning apparatus as set forth in claim 1, wherein said capacitor chip is formed with said terminals at its opposite ends and is electrically connected to said two external terminals in such a manner as to bridge the latter.

5. A tuning apparatus as set forth in claim 1, wherein said hollow space of said base member comprises a recess capable of receiving at least said two external terminals and said capacitor chip fixedly connected thereto.

6. A tuning apparatus as set forth in claim 1, wherein a core member is provided with respect to said coils.

7. A tuning apparatus as set forth in claim 6, wherein said core member is adjustably installed.

8. A tuning apparatus as set forth in claim 1, wherein there is provided a casing member for receiving said base member and said coil.

9. A tuning apparatus as set forth in claim 7, wherein said core member is rotatable and there is also provided a casing member for rotatably supporting said core member and for receiving said base member and said core member.

10. A method of producing a tuning apparatus comprising the steps of;

preparing a comb-shaped electrically conductive metal member including at least two comb teeth integrally joined together at first respective ends, connecting a capacitor chip between the other ends of said comb teeth of said comb-shaped metal member, preparing a base member formed with a hollow space for receiving said other ends of said comb teeth and said capacitor, fixing a coil to said base member, inserting said metal member into said hollow space of said base member to position said chip and said other ends therein, filling said hollow space of said base member with resin whereby said metal member is fixed to said base member, severing said first ends of said comb teeth to separate them from each other, and connecting the terminals of said coil to said comb teeth.

11. A method as set forth in claim 10, wherein said step of inserting said metal member into said hollow space of said base member to position said chip and said other ends therein precedes the step of filling said hollow space with resin.

12. A method as set forth in claim 10, said step of inserting said metal member into said hollow space of said base member to position said chip and said other ends therein follows the step of filling said hollow space of said base member with resin.

13. A method as set forth in claim 10, wherein said step of fixing the coil to said base member precedes the step of inserting said metal member into said hollow space to position said chip and said other ends therein.

14. A method as set forth in claim 10, wherein said step of fixing the coil to said base member is performed after the structure including said base member and said metal member is completed.

15. A method as set forth in claim 10, wherein said capacitor chip is of the type having terminals formed at it opposite ends.

16. A method as set forth in claim 15, wherein said step of connecting the capacitor chip between said other ends of said comb teeth of said comb-shaped metal member comprises the steps of;

temporarily positioning said capacitor chip so that its terminals are brought into contact with said other ends of said comb teeth, and performing a solder dip process in that condition.

* * * * *